(12) United States Patent
Thalmann

(10) Patent No.: US 7,343,532 B2
(45) Date of Patent: Mar. 11, 2008

(54) TESTING MEMORY UNITS IN A DIGITAL CIRCUIT

(75) Inventor: Erwin Thalmann, Munich (DE)

(73) Assignee: Infineon Technologies AG, Munich (DE)

( * ) Notice: Subject to any disclaimer, the term of this patent is extended or adjusted under 35 U.S.C. 154(b) by 952 days.

(21) Appl. No.: 10/441,609

(22) Filed: May 20, 2003

(65) Prior Publication Data

US 2005/0071712 A1 Mar. 31, 2005

(30) Foreign Application Priority Data

May 24, 2002 (DE) ................. 102 23 167

(51) Int. Cl.
*G11C 29/00* (2006.01)
*G11C 7/00* (2006.01)

(52) U.S. Cl. ...................... 714/718; 365/201

(58) Field of Classification Search ............ None
See application file for complete search history.

(56) References Cited

U.S. PATENT DOCUMENTS

| | | | |
|---|---|---|---|
| 4,300,234 A * | 11/1981 | Maruyama et al. ......... 714/718 |
| 5,432,797 A * | 7/1995 | Takano ........................ 714/718 |
| 5,889,786 A * | 3/1999 | Shimogama ................ 714/720 |
| 6,198,669 B1 | 3/2001 | Iguchi |
| 6,779,144 B2 * | 8/2004 | Hayashi et al. ............. 714/731 |
| 2003/0021169 A1 | 1/2003 | Beer et al. |

FOREIGN PATENT DOCUMENTS

| | | |
|---|---|---|
| DE | 199 51 534 A1 | 5/2000 |
| DE | 101 35 966 A1 | 2/2003 |
| EP | 324386 A2 * | 7/1989 |
| JP | 56140440 A * | 11/1981 |
| JP | 10112199 A * | 4/1998 |

OTHER PUBLICATIONS

German Office Action dated May 24, 2002 (3 pages).

* cited by examiner

*Primary Examiner*—Cynthia Britt
(74) *Attorney, Agent, or Firm*—Fish & Richardson P.C.

(57) ABSTRACT

A method of testing a memory unit in a digital circuit includes storing a test pattern on a register of the digital circuit. The register is then selected by providing an activation signal to a selection unit. The memory unit is then tested with the test pattern stored in the register.

6 Claims, 3 Drawing Sheets

TESTING MEMORY UNITS IN A DIGITAL CIRCUIT

RELATED APPLICATIONS

This application claims the benefit of DE 102.23.167.2, filed on May 24, 2002, the contents of which are herein incorporated by reference.

FIELD OF INVENTION

The present invention relates to the testing of digital circuits, and relates in particular to the testing of memory units in digital circuits by means of efficient test methods.

BACKGROUND

When testing memory units in digital circuits, registers in which predeterminable test patterns are stored are usually provided in the digital circuit. Said test patterns comprise different topologies or test topologies, the topologies being able to be varied from test mode to test mode.

One disadvantage of conventional methods for testing memory units in digital circuits is that the test times per chip (digital circuit) increase on account of continually increasing storage capacities. The test times of digital circuits are disadvantageously correlated with the costs for the digital circuit, i.e. long test times increase the price of digital circuits. As the complexity of digital circuits increases, the outlay in creating a digital circuit shifts more and more from pure hardware design toward the implementation of complex test and simulation sequences.

It is thus clearly evident that, to reduce costs in the production and testing of digital circuits, it is necessary in particular to reduce the test times. In order to reduce the test times and thus the test costs, it has already been proposed to increase a parallelism. In digital circuits, in particular in digital memory circuits, internal registers for storing topologies are implemented, different topologies being required in order to realize "worst case" conditions in a memory cell array. The different topologies are stored in the registers of the digital circuit in order to be used in a subsequent test.

In the event of alternating between the different topologies, two different procedures are available, in principle.

(i) Repetition of a register by means of a test mode after testing of memory units in the digital circuit, or

SUMMARY (ii) Changeover between different registers which contain correspondingly different topologies.

The method (i) specified above has the advantage that only a single register is necessary, in principle. However, a significant disadvantage of the method (i) is that it is necessary to reload the entire register content, so that a test pattern sequence is in each case interrupted during a reloading time. The method (ii) has the advantage that a changeover can be made during a run time of the test mode ("on the fly"), but the digital circuit unit must have additional terminal pins for addressing the respective registers.

Conventional test apparatuses have only two registers which can be addressed via an external terminal unit for a clock signal ("clock enable" (CKE)). However, the conventional test apparatus is disadvantageously limited to two registers since additional external terminal units would be required for addressing further registers. In a disadvantageous manner, however, test systems cannot be provided arbitrarily with external terminal units, so that, on account of hardware limitations, it is not possible to test memory units in an efficient manner. It is not desirable to increase the number of external terminal units for the purpose of changing over registers. Rather, the intention is to provide as few external circuit units as possible in order, on account of a smaller number of external pins (terminal units) required, to provide an increased parallelism and to save test costs in this way.

To date, it has only been possible to drive two registers with one external terminal unit (CKE). By way of example, four internal registers would already necessitate two external terminal units, and eight internal registers would already necessitate three external terminal units, etc.

Therefore, it is an object of the present invention to develop a method for testing a memory unit in a digital circuit, in which at least one test pattern is stored in at least one register of the digital circuit, at least one register is selected by means of an activation signal, and the memory unit to be tested is tested by means of the test patterns stored in the at least one activated register, in such a way that more than two internal registers can be driven without increasing a number of external terminal units.

An essential concept of the invention is that a plurality of different registers containing test topologies are used for register activation by means of existing column and/or row addressing lines which are already present for the addressing of the at least one memory unit in the digital circuit.

Consequently, an essential advantage of the invention is that existing terminal units of the digital circuit can be used to address an arbitrary number of internal registers.

The invention's method for testing at least one memory unit in a digital circuit has the following steps:

a) storage of at least one test pattern in at least one register of the digital circuit;
b) selection of at least one register by means of an activation signal;
c) testing of the memory unit to be tested by means of the test pattern stored in the at least one activated register; and
d) selection of the at least one register to be activated by means of a selection unit, to which the activation signal is fed.

Furthermore, the invention's circuit arrangement for testing at least one memory unit in the digital circuit essentially has:

a) at least one register for storing at least one test pattern;
b) an activation signal generating device for generating an activation signal;
c) connecting means for electrically connecting the at least one register to the memory unit to be tested; and
d) a selection unit for selecting the at least one register to be activated in accordance with the activation signal that is fed.

In accordance with one preferred development of the present invention, the activation signal is fed to the selection unit via addressing lines of the at least one memory unit.

In an advantageous manner, the addressing lines of the memory units are already arranged in the digital circuit, so that no additional external terminal units are required for such driving of the selection unit.

In accordance with a further preferred development of the present invention, column addressing lines and/or row addressing lines of the at least one memory unit in the digital circuit are provided as addressing lines.

In accordance with yet another preferred development of the present invention, test sequences of test patterns are predetermined externally, a test mode expediently defining a sequence of the registers which are to be addressed and which have different topologies.

In accordance with yet another preferred development of the present invention, for the selection of at least one register, at least two addressing lines are logically combined in the selection unit. Furthermore, it is expedient for more than two selection lines to be logically combined in order to increase a number of drivable registers of the digital circuit.

In accordance with yet another preferred development of the present invention, the selection unit for selecting the at least one register to be activated in accordance with the activation signal that is fed contains a logic combination unit which provides a logic combination of at least two addressing signals that are fed.

BRIEF DESCRIPTION OF THE DRAWINGS

Exemplary embodiments of the invention are illustrated in the drawings and are explained in more detail in the description below. In the drawings.

DETAILED DESCRIPTION

In the figures, identical reference symbols designate identical or functionally identical components or steps.

Figure 1:
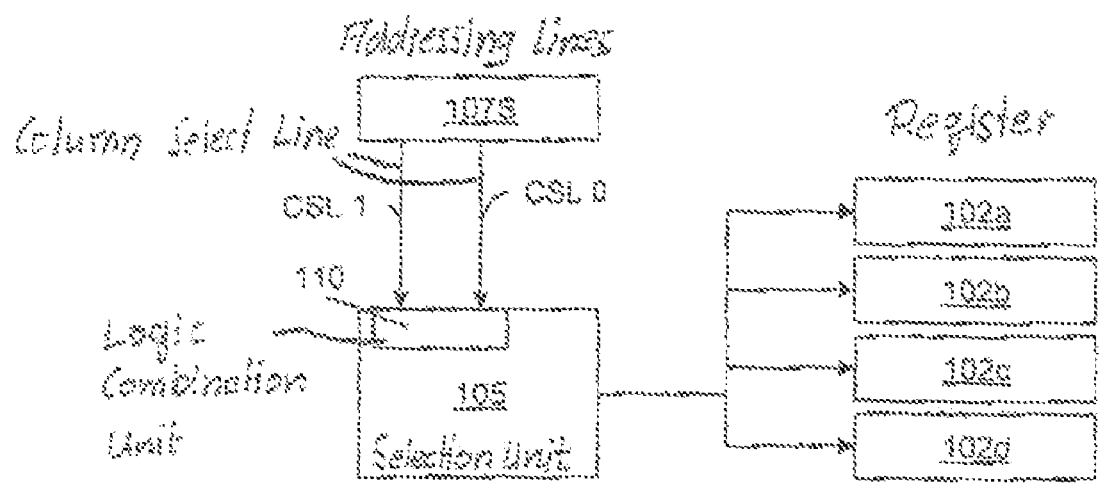
FIG. 1 shows a block diagram of the driving, according to the invention, of four different registers by means of a selection unit using column addresses.

Four registers 102a-102d are illustrated by way of example in the block diagram shown in FIG. 1. It should be pointed out, however, that two or more registers can be driven by the method according to the invention. In the exemplary embodiment shown in FIG. 1, two column addressing lines 107S, for driving the registers 102a-102d, are logically combined in a logic combination unit 110. The logic combination unit 110 is contained in the selection unit 105 according to the invention.

Figure 2:
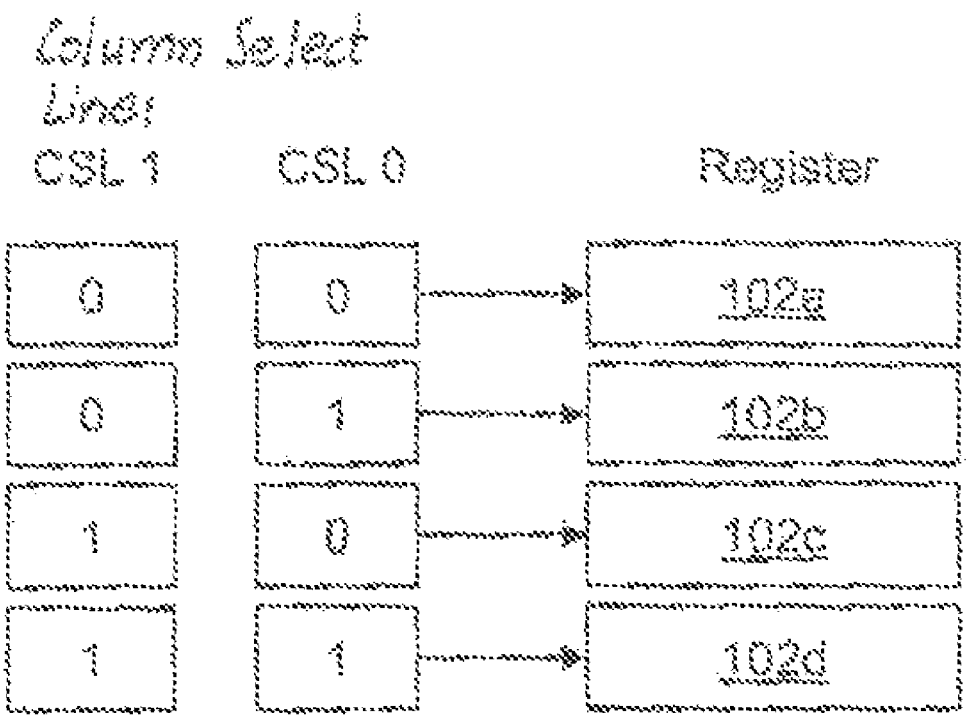
FIG. 2 shows a table illustrating a logic combination of two column addressing lines for addressing the registers shown in FIG. 1.

With reference to the table illustrated in FIG. 2, an unambiguous assignment of the registers 102a-102d is possible on the basis of two column addressing signals CSL0 and CSL1, respectively. Thus, a binary number 00 (zero) corresponds to the register 102a, a logical binary number 01 (one) corresponds to the register 102b, a logical binary number 10 (two) corresponds to the register 102c and a logical binary number 11 (three) corresponds to the register 102d. The register 102a-102d shown in FIG. 1 is driven in accordance with the selection according to the table in FIG. 2. In this way, provision of the topology stored in the register is made possible in order to use said topology in a subsequent test.

In an advantageous manner, it is no longer necessary to reload topologies into an individual register. Besides the use of two or more column addressing lines 107S, it is also possible to use two or more row addressing lines 107Z for the logic combination and thus driving of the registers. Furthermore, besides the column 107S and/or row addressing lines 107Z, it is possible to use, in addition, one or more clock enable lines.

Figure 3:
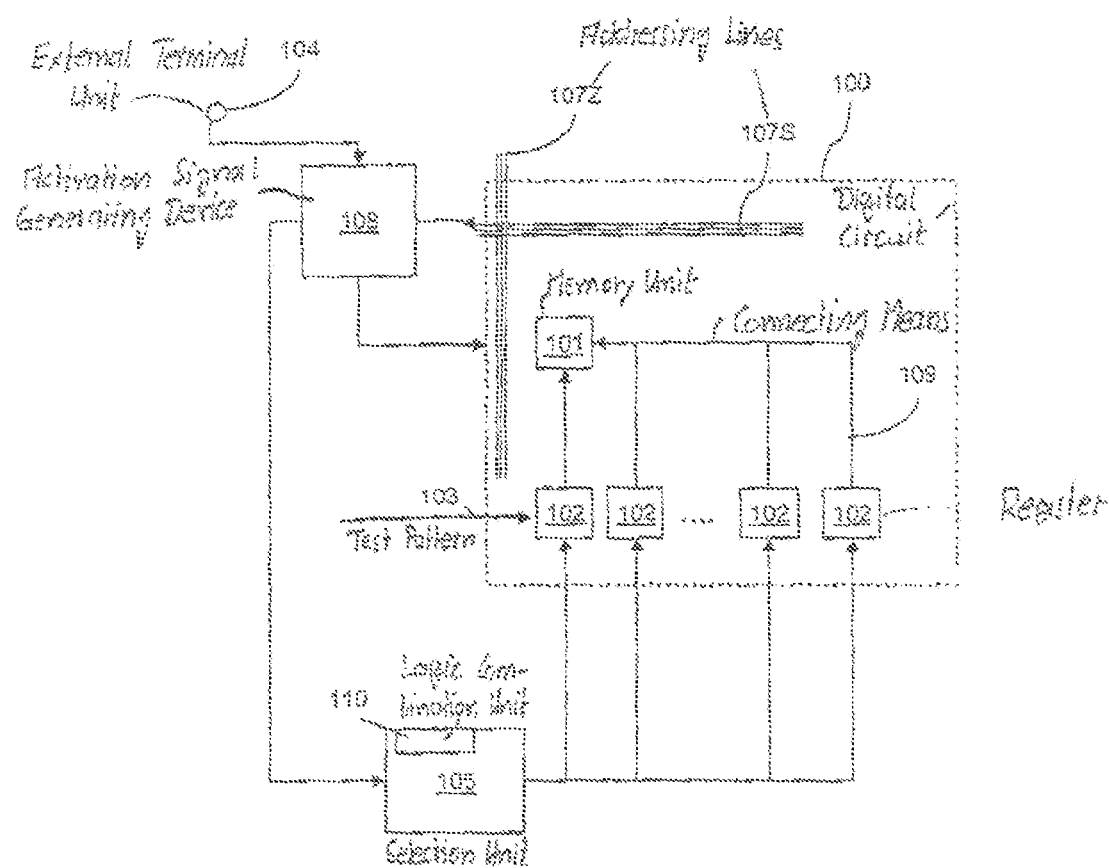
FIG. 3 shows an overall block diagram of an arrangement having the selection unit according to the invention for driving registers of a digital circuit.

FIG. 3 shows an overall block diagram of a circuit arrangement for testing memory units 101 in a digital circuit 100. In the preferred exemplary embodiment according to the present invention as shown in FIG. 3, the registers 102 are arranged within the digital circuit 100. Furthermore, the digital circuit 100 contains the memory units 101 to be tested, the registers 102 being connected to the memory units 101 to be tested via connecting means 109, which are provided as electrical lines. The at least one memory unit is addressed in a conventional manner via addressing lines 107. FIG. 3 illustrates both column addressing lines 107s and row addressing lines 107Z.

A combination of at least two addressing lines in accordance with FIGS. 1 and 2 now permits a selection of the registers 102. Test patterns 103 are stored in the registers 102, said test patterns being stored in the register before the corresponding test sequence. The at least one addressing signal of the at least one row addressing line 107Z and/or the at least one addressing signal of the at least one column addressing line are logically combined in the logic combination unit 110 of the selection unit 105. In this way, it is possible to address a specific register 102 in accordance with the logic combination.

Furthermore, it is possible to feed a corresponding activation signal 106 for the registers to an external terminal unit 104. It is thus possible to feed an activation signal 106 to the selection unit 105 both via an activation signal generating device and via column and/or row addressing lines 107S and 107Z, respectively.

Although the present invention has been described above using preferred exemplary embodiments, it is not restricted thereto, but rather can be modified in diverse ways.

Moreover, the invention is not restricted to the application possibilities mentioned.

The invention claimed is:

1. A method of testing a memory unit in a digital circuit, the method comprising:
    storing a test pattern on a register of the digital circuit;
    selecting the register by providing an activation signal to a selection unit, wherein selecting the register comprises logically combining signals from at least two addressing lines in the selection unit; and
    using the test pattern that has been stored in the register, for testing the memory unit.

2. The method of claim 1, wherein selecting the register comprises feeding the activation signal to the selection unit via addressing lines of the memory unit.

3. The method of claim 2, further comprising selecting the addressing lines to be column addressing lines.

4. The method of claim 2, further comprising selecting the addressing lines to be row addressing lines.

5. The method of claim 1, further comprising externally predetermining test sequences of test patterns.

6. A circuit arrangement for testing a memory unit in a digital circuit, the circuit arrangement comprising:
    a register for storing a test pattern that is used to test the memory unit;
    an activation signal generator for generating an activation signal for activating the register;
    an electrical connection between the memory unit and the register; and
    a selection unit for selecting the register on the basis of the activation signal, wherein the selection unit comprises a logic combination unit for logically combining at least two addressing signals provided by the activation signal generator.

* * * * *